United States Patent
Zuniga et al.

[11] Patent Number: 5,837,558
[45] Date of Patent: Nov. 17, 1998

[54] INTEGRATED CIRCUIT CHIP PACKAGING METHOD

[75] Inventors: Edgar R. Zuniga, Sherman; Mary E. Helmick, Plano, both of Tex.

[73] Assignee: Texas Instruments Incorporated, Dallas, Tex.

[21] Appl. No.: 963,799

[22] Filed: Nov. 4, 1997

[51] Int. Cl.[6] .......................... G01R 31/26; H01L 21/66; H01L 21/44; H01L 21/48; H01L 21/50
[52] U.S. Cl. .............................. 438/15; 438/115; 438/127
[58] Field of Search ....................... 438/115, 126, 438/127, 370, 371, 379, 15

[56] References Cited

U.S. PATENT DOCUMENTS

| | | |
|---|---|---|
| 4,017,495 | 4/1977 | Jaffe et al. . |
| 4,468,411 | 8/1984 | Sloan et al. . |
| 4,558,510 | 12/1985 | Tani et al. . |
| 5,668,405 | 9/1997 | Yamashita et al. . |

*Primary Examiner*—John Niebling
*Assistant Examiner*—Josetta I. Jones
*Attorney, Agent, or Firm*—W. James Brady, III; Richard L. Donaldson

[57] ABSTRACT

An improved method for packaging an integrated circuit chip is disclosed. In accordance with the invention, an integrated circuit chip (12) is mounted on a leadframe (18) having a plurality of leads (20). The integrated circuit chip is electrically connected to the leadframe with wire bonds (22). An encapsulant (26) is then molded around the integrated circuit chip and the leadframe. In a dry bake step, moisture is removed from the encapsulant (26) for dry shipment of the integrated circuit chip subsequent to the molding step. The encapsulant (26) is cured simultaneously with the dry bake step, thus reducing the time and power required to produce the integrated circuit chip package.

12 Claims, 1 Drawing Sheet

INTEGRATED CIRCUIT CHIP PACKAGING METHOD

TECHNICAL FIELD OF THE INVENTION

This invention relates generally to the field of integrated circuit chips and more particularly to an improved integrated circuit chip packaging method.

BACKGROUND OF THE INVENTION

The processes involved in the fabrication and packaging of integrated circuit chips are well known. Typically, an array of identical circuits is patterned onto a circular semiconductor wafer using well known photolithographic techniques. The wafer is then sawed into many rectangular pieces to separate the individual circuits from one another, so that each circuit occupies its own circuit chip.

The chips are individually mounted onto lead frames, where they are held in place by means of an epoxy. A wire bonder is then used to establish electrical connections between the bond pads on the chip and the respective leads of the lead frame.

With the chip physically and electrically connected to the lead frame, the chip and lead frame are placed into an injection molder, where plastic is injected to surround the assembly. This plastic packaging serves to protect the chip from exposure to light, which could damage the circuit components, as well as making the entire assembly mechanically rigid and durable. The molded plastic is then cured by means of heating in an oven for several hours.

Next, the leads of the lead frame are trimmed and formed into the desired shape. For example, the leads may be formed into a "gull wing" shape for surface-mounted chips. At this stage, various electrical and mechanical tests are performed to determine whether the chip will function for its intended purpose.

If the chip package is classified as moisture-sensitive, then prior to shipment of the finished chip to the customer, a dry bake process is performed to remove moisture from the chip package. Without this step, the plastic packaging is likely to fracture during soldering due to the internal pressure of expanding water vapor. After the dry bake, the chips are packed in sealed, desiccated pouches and shipped to the customer.

The integrated circuit chip industry is very cost-competitive. It is therefore desirable to shorten, streamline or eliminate any of the steps described above in order to shorten production time and reduce production costs for the chips.

SUMMARY OF THE INVENTION

Therefore, a need has arisen for an integrated circuit chip packaging method that overcomes the disadvantages and deficiencies of the prior art. An improved method for packaging an integrated circuit chip is disclosed. According to the teachings of the present invention, the integrated circuit chip is mounted on a leadframe having a plurality of leads. The integrated circuit chip is electrically connected to the leadframe with wire bonds. An encapsulant is then molded around the integrated circuit chip and the leadframe. Moisture is removed from the encapsulant for dry shipment of the integrated circuit chip subsequent to the molding step. The encapsulant is cured simultaneously with the moisture removal step.

A technical advantage of the present invention is that the disclosed method combines the steps of curing the encapsulant and removing moisture from the encapsulant, thus reducing the time required to produce an integrated circuit chip package. Another technical advantage is that less power is consumed in producing an integrated circuit chip package in accordance with the invention.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

Figures 1, 2, 3:
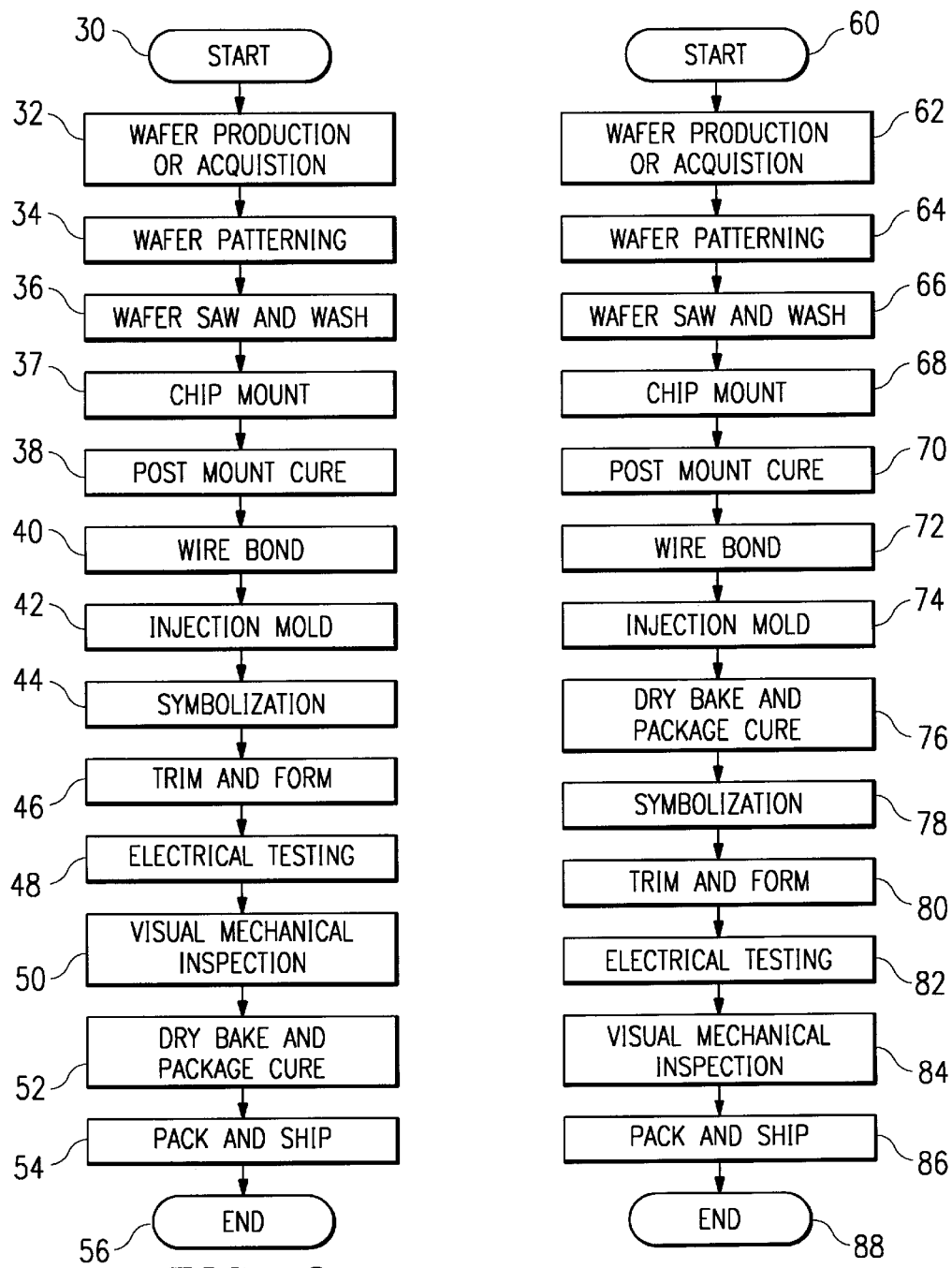
FIG. 1 is a cross section of an integrated circuit chip package produced in accordance with the present invention.
FIG. 2 is a flowchart illustrating an improved integrated circuit chip packaging method.
FIG. 3 is a flowchart illustrating an alternative integrated circuit chip packaging method in accordance with the present invention.

The preferred embodiment of the present invention and its advantages are best understood by referring to FIGS. 1, 2 and 3 of the drawings, like numerals being used for like and corresponding parts of the various drawings.

Referring to FIG. 1, an integrated circuit chip package 10 manufactured in accordance with the present invention is shown. Package 10 includes an integrated circuit chip 12 mounted on a die pad 14 by means of a suitable die attach medium 16, such as epoxy. Die pad 14 is part of a leadframe 18, which also include gull-wing shaped leads 20. Wire bonds 22 provide electrical connections between bond pads 24 on integrated circuit chip 12 and leads 20 of leadframe 18. Integrated circuit chip 12, die pad 14, wire bonds 22 and portions of leads 20 are surrounded by a molded plastic encapsulant 26. Encapsulant 26 is mechanically rigid, opaque and electrically insulating. As will be discussed more fully below, the fabrication of integrated circuit chip package 10 is accelerated by virtue of encapsulant 26 not being cured until integrated circuit chip package 10 has been fully assembled and tested.

Referring to FIG. 2, a flowchart illustrating an improved method for producing integrated circuit chip package 10 is shown. The method begins at step 30 and proceeds to step 32, where a semiconductor wafer of the type commonly used in integrated circuit fabrication is either manufactured or acquired from a vendor of such wafers. At step 34, an array of identical circuits is patterned onto the semiconductor wafer using suitable microlithographic techniques such as epitaxy, ion implantation and etching. At step 36, the semiconductor wafer is placed on an adhesive surface and sawed along sawing streets into many rectangular pieces, each piece having one of the identical circuits which were patterned on the surface of the semiconductor wafer. Integrated circuit chip 12 may comprise one of those pieces.

At step 37, a die attach medium 16, such as epoxy, is placed upon die pad 14 of leadframe 18. Integrated circuit chip 12 is then removed from the adhesive surface and mounted on die pad 14, where integrated circuit chip 12 is held in place by die attach medium 16. Proceeding to step 38, the integrated circuit chip assembly comprising integrated circuit chip 12, leadframe 18 and die attach medium 16 is placed in a curing oven and heated to a temperature of approximately 175° C. to evaporate epoxy solvents and chemically cure die attach medium 16. Alternatively, a hot plate or microwave oven may be used to cure die attach medium 16.

At step 40, the integrated circuit chip assembly is placed in a wire bonder of the type commonly used in integrated circuit fabrication. The wire bonder attaches wire bonds 22 to bond pads 24 on integrated circuit chip 12 and leads 20 on leadframe 18.

At step 42, the integrated circuit chip assembly is placed in an injection molder of the type commonly used in integrated circuit fabrication. Integrated circuit chip 12 and leadframe 18 are surrounded by a thin, rectangular mold, with only leads 20 protruding from the sides of the mold. A heated liquid plastic encapsulant, or mold compound, is injected into the mold to encase integrated circuit chip 12, die pad 14 and wire bonds 22. Integrated circuit chip package 10 is then removed from the injection molder and encapsulant 26 cools and hardens into the thin, rectangular shape defined by the mold.

In contrast to known packaging methods, encapsulant 26 is not cured as the next step of the packaging process. Rather, at step 44, the plastic encapsulant 26 is marked with a symbol identifying the type of integrated circuit chip 12 included in package 10, the chip manufacturer and other identifying information. This marking step is performed using either known laser etching methods or with an ink, which is then cured.

At step 46, leads 20 of leadframe 18 are trimmed and formed into a desired shape. Prior to this step, leads 20 projected straight outward from the sides of package 10, and were attached at their ends to a leadframe assembly containing many identical leadframes. At step 46, which may be performed in an automatic press, the ends of leads are detached from the leadframe assembly. If leads 20 are joined together by surplus metal for mechanical support, then this metal is also removed at step 46. Finally, leads 20 are formed by the press into the desired shape, such as the gull-wing shape illustrated in FIG. 1.

Proceeding to step 48, package 10 is placed on a testing platform where leads 20 are aligned with electrical contact surfaces. Electrical signals are supplied to leads 20 to test the operation of integrated circuit chip 12 and the electrical contacts formed by wire bonds 22. At step 50, package 10 is inspected visually to determine whether any errors have been made in any of the previous steps.

At step 52, package 10 is dry-baked to reduce the moisture content of encapsulant 26 to 0.05% by weight or less. Excess moisture in encapsulant 26 could cause the encapsulant to fracture during subsequent high-temperature operations, such as soldering leads 20 to a circuit board.

In this example, the dry bake step 52 begins with placing package 10 on a rack with other similar packages. The rack is placed in a dry bake oven, which heats package 10 to a temperature of approximately 125° C. for approximately eight hours to remove moisture from package 10. Alternatively, package 10 may be heated to a temperature of approximately 175° C. for approximately four hours. Package 10 is then removed from the dry bake oven and allowed to cool.

An additional, beneficial effect of the dry bake process is that, since encapsulant 26 was not cured at any previous step in the packaging process, and since the dry bake process is conducted at a temperature similar to that typically used to cure encapsulant 26, the encapsulant is cured during the dry bake process. This combination of the encapsulant curing process and the dry bake process saves several hours and considerable cost in the overall integrated circuit fabrication process.

At step 54, package 10 is placed into a sealed, desiccated pouch, along with other similar packages, for shipment to a purchaser of the packages. At step 56, the improved integrated circuit chip packaging method ends.

Referring to FIG. 3, a flowchart illustrating an alternative packaging process in accordance with the present invention is shown. The process begins at step 60 and proceeds through step 74 in a series of steps identical to steps 30 through 42 described above. However, after the injection mold step 74, integrated circuit chip package 10 is dry-baked and cured at step 76, in the manner described above with respect to step 52 shown in FIG. 2. The process continues with steps 78 through 84, which correspond to previously-described steps 44 through 50, and step 86, which corresponds to previously-described step 54.

The dry bake step 76 removes all or most of the moisture from integrated circuit chip package 10. If integrated circuit chip package 10 is exposed to normal atmospheric humidity for a sufficient period of time, in this example approximately eight hours, integrated circuit chip package 10 will re-absorb moisture from the atmosphere, thus negating the beneficial effects of the dry bake process. The amount of time for which integrated circuit chip package 10 may safely be exposed to atmospheric humidity following dry bake depends on the geometry and other parameters of integrated circuit chip package 10.

To prevent integrated circuit chip package 10 from re-absorbing moisture after dry bake and cure step 76, steps 78 through 84 must be performed in less than eight hours, so that integrated circuit chip package 10 may be placed in a desiccated, sealed pouch at step 86 and thereby protected from atmospheric humidity.

At step 86, the pouch in which integrated circuit chip package 10 is to be shipped to the customer may be marked with a notice setting forth the maximum amount of time for which integrated circuit chip package 10 should be exposed to atmospheric humidity by the customer prior to soldering. The time marked on the pouch preferably represents the known maximum exposure time for integrated circuit chip package 10, less the amount of time spent performing steps 78 through 84 after dry bake. The process ends at step 88.

While the invention has been particularly shown and described by the foregoing detailed description, it will be understood by those skilled in the art that various other changes in form and detail may be made without departing from the spirit and scope of the invention.

What is claimed is:

1. A method for packaging an integrated circuit chip, comprising the steps of:

mounting the integrated circuit chip on a leadframe having a plurality of leads;

molding an encapsulant around the integrated circuit chip and the leadframe;

forming the leads of the leadframe into a selected shape;

curing the encapsulant subsequent to the forming step; and removing moisture from the encapsulant simultaneously with the curing step.

2. The method of claim 1, further comprising the step of electrically connecting the integrated circuit chip to the leadframe subsequent to the mounting step.

3. The method of claim 2, further comprising the step of electrically testing the integrated circuit chip and the leadframe subsequent to the connecting step.

4. The method of claim 1, wherein the moisture removal step comprises the step of reducing a moisture content of the encapsulant to no more than 0.05% by weight.

5. A method for packaging an integrated circuit chip, comprising the steps of:

mounting the integrated circuit chip on a leadframe having a plurality of leads;

electrically connecting the integrated circuit chip to selected leads of the leadframe;

molding an encapsulant around the integrated circuit chip and the leadframe;

removing moisture from the encapsulant for dry shipment of the integrated circuit chip subsequent to the molding step; and curing the encapsulant simultaneously with the moisture removal step.

6. The method of claim 5, further comprising the step of electrically testing the integrated circuit chip and the leadframe subsequent to the connecting step.

7. The method of claim 5, further comprising the step of forming the leads of the leadframe into a selected shape.

8. The method of claim 5, further comprising the step of forming the leads of the leadframe into a selected shape subsequent to the moisture removal step.

9. The method of claim 5, further comprising the step of forming the leads of the leadframe into a selected shape prior to the curing step.

10. The method of claim 5, wherein the moisture removal step comprises the step of reducing a moisture content of the encapsulant to no more than approximately 0.05% by weight.

11. A method for packaging an integrated circuit chip, comprising the steps of:

mounting the integrated circuit chip on a leadframe having a plurality of leads;

electrically connecting the integrated circuit chip to selected leads of the leadframe;

electrically testing the integrated circuit chip and the leadframe subsequent to the connecting step;

molding an encapsulant around the integrated circuit chip and the leadframe;

forming the leads of the leadframe into a selected shape subsequent to the molding step;

removing moisture from the encapsulant for dry shipment of the integrated circuit chip subsequent to the molding step; and curing the encapsulant simultaneously with the moisture removal step.

12. The method of claim 11, wherein the moisture removal step comprises the step of maintaining the encapsulant at a temperature of approximately 125° C. for approximately eight hours.

* * * * *